(12) United States Patent
Ota

(10) Patent No.: US 6,490,402 B1
(45) Date of Patent: Dec. 3, 2002

(54) FLEXIBLE FLAT COLOR DISPLAY

(75) Inventor: Takaaki Ota, San Diego, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 300 days.

(21) Appl. No.: 09/632,020

(22) Filed: Aug. 2, 2000

(51) Int. Cl.$^7$ ................................................. G02B 6/00
(52) U.S. Cl. ........................ 385/147; 385/901; 385/49; 385/89; 385/116; 362/554; 362/555; 345/46
(58) Field of Search ................................. 385/147, 901, 385/115, 116, 89, 49; 372/6, 50; 362/551, 552, 553, 554, 555, 561; 313/500, 505; 348/790, 791, 793, 815; 257/80, 93, 544; 345/46, 84

(56) References Cited

U.S. PATENT DOCUMENTS

| | | | |
|---|---|---|---|
| 3,700,802 A | 10/1972 | Markin et al. | ........... 178/7.3 D |
| 3,947,721 A | 3/1976 | Suenami et al. | |
| 4,394,600 A | 7/1983 | Flannagan | |
| 4,920,917 A | 5/1990 | Nakatani et al. | |
| 4,956,683 A | 9/1990 | Quintana | |
| 5,747,928 A | 5/1998 | Shanks et al. | |
| 5,931,764 A | 8/1999 | Freeman et al. | |
| 5,962,967 A | 10/1999 | Kiryuschev et al. | ........ 313/491 |
| 6,042,687 A | 3/2000 | Singh et al. | |
| 6,259,838 B1 * | 7/2001 | Singh et al. | ................... 385/31 |

OTHER PUBLICATIONS

*Device Application Notes*, EMCORE Device Application Notes: Visible LEDs (InGaAIP), printed from website May 1, 2000.
Andrew Bierman, *LEDs: From Indicators to Illuminators?*, Lighting Transformations: Light–Emitting Diodes, printed from website May 1, 2000.
*The History of LED Technology*, marktech optoelectronics website, site last modified Feb. 14, 2000, article printed May 1, 2000.
Jen–Francois Tremblay, *The Skinny on Flat–Screen Displays*, C & EN Hong Kong, Jul. 19, 1999.
*Active Matrix LCDs*, WTEC Hyper–Librarian, Liquid Crystal and Other Non Emissive Displays Published Dec. 1994.
*Active matrix*, DotCom Computer & Web Services; http://www.tcdot.com/terms/activematrix.htm, printed Nov. 23, 1999.
*What is Flat Screen Plasma Technology?*, Plasma–USA, printed from website on Apr. 13, 2000.
John Bond, *Advanced displays mobilize applications*, Portable Design, Editorial Jul. 1999.
Curt Stutz, *Active Matrix Display*, www.rose–hulman.edu Technical Description printed Nov. 23, 1999.

* cited by examiner

Primary Examiner—Hemang Sanghavi
(74) Attorney, Agent, or Firm—Wood, Herron & Evans, L.L.P.

(57) ABSTRACT

A flexible electronic color display includes a light-emitting diode (LED) matrix formed from an interweaved weft of conductive strands and warp of light-emitting diode (LED) fiber of a conductive core coated with a p-doped semiconductor and then an n-doped semiconductor of light-emitting polymer. Each conductive strand physically and electrically couples to each LED fiber at one location to form an LED that may activated as a pixel. Alternating LED fibers of different hues may provide a color display, especially for a relatively fine weave or for displays viewed from a distance. Alternatively, conductive strands and LED fibers may be selected having sufficient transparency that layers of multiple LED matrices, each having a selected hue, may form a color flexible display. In addition, methods for fabricating the LED matrix and for detecting and eliminating flaws from the LED matrix allow for economical manufacture.

18 Claims, 10 Drawing Sheets

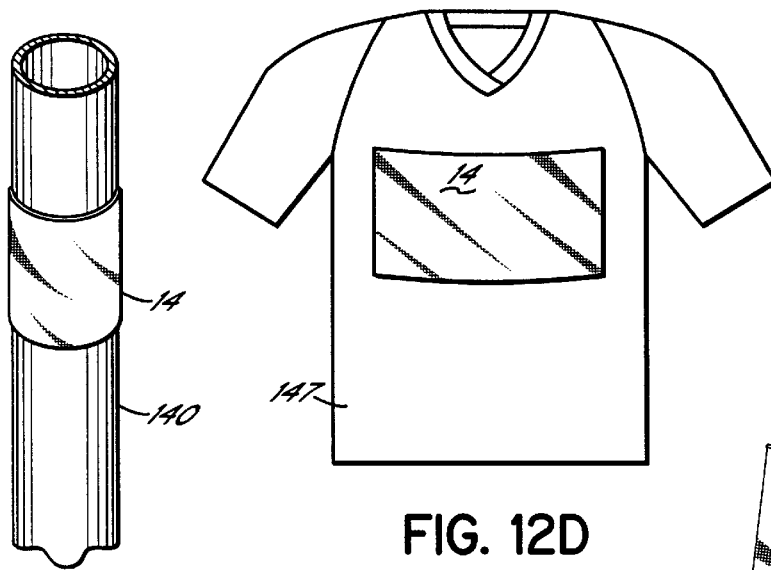
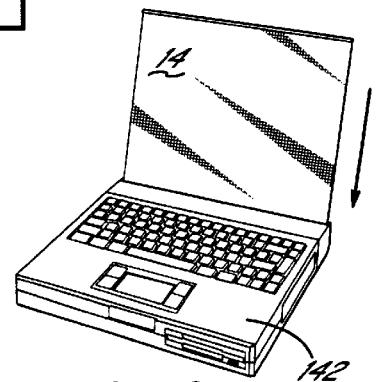
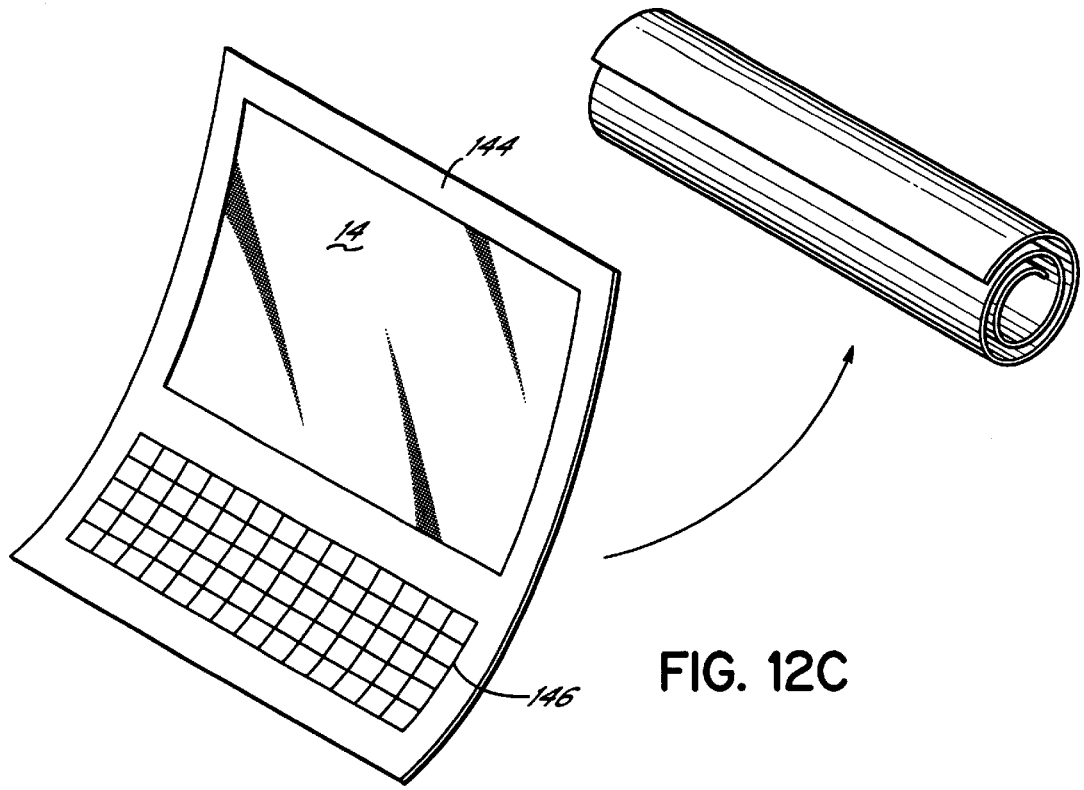
FIG. 12A
FIG. 12D
FIG. 12B
FIG. 12C

FLEXIBLE FLAT COLOR DISPLAY

FIELD OF THE INVENTION

The present invention generally relates to electronic, light-emitting displays.

BACKGROUND OF THE INVENTION

Electronic displays present various forms of display information, such as text, graphics, and video, as a pixelized image to a user. The presentation of pixelized display information may be an essential function of an electronic device, such as personal computer. In other applications, pixelized display information enhances the features of an electronic device, such as enabling a cellular telephone to be readily programmable and to provide functions such as digital paging.

A number of electronic display technologies are available, each having specific attributes that limit their application. Cathode Ray Tubes (CRTs), for instance, are widely used for computer monitors and televisions. CRTs have good color, contrast, and brightness, as well as being a mature, economical technology. CRTs are not particularly compact, being limited by the geometries imposed by its electron gun and pixel elements formed at substantially perpendicular relation to the electron gun. Moreover, the vacuum requirements of a CRT dictate a heavy glass construction. Thus, the size, weight, rigid fragile construction, and power consumption of CRTs limits their use in portable applications.

As an alternative to CRTs, plasma screen technology allows for a display flatter and wider than CRTs and rear projection televisions. However, plasma screen technology is difficult to manufacture, and thus expensive. Moreover, although flatter than CRTs, plasma screens have similar limitations as do CRTs for weight and rigidity. Consequently, plasma screen displays are used in certain notebook computers and relatively expensive portable devices.

Various other technologies allow for flat, lighter weight, and lower power consumption than CRTs, appropriate to more portable applications. Liquid Crystal Displays (LCD) and active matrix LCDs are widely used in notebook computers and personal digital assistant (PDA) products, for example. To provide a degree of flexibility and resistance to impact, plastic LCDs are known. Also, LCDs are generally less expensive than other displays of comparable size; however, LCDs are generally too expensive to incorporate into limited life, disposable products.

Consequently, a significant need exists for a light weight, inexpensive display, especially a color display that is suitable for use in portable electronic devices and a variety of applications.

SUMMARY OF THE INVENTION

The present invention generally provides a light-emitting fabric that provides for a flexible display suitable for use as a substitute for known portable electronic displays, as well as enabling new applications unsuited to known display technology.

In one aspect consistent with the invention, a light-emitting diode (LED) matrix is formed from interlaced weft of conductive strands and warp of LED fibers. The LED fibers have a conducting core, a first doped layer surrounding the core, and a second doped layer surrounding the first doped layer. The first and second doped layers form a light-emitting semiconductor junction. Each conductive strand electrically couples to each LED fiber at a respective lateral location, forming a light-emitting diode (LED) at each lateral location.

In another aspect consistent with the invention, a method of fabricating a light-emitting diode (LED) matrix includes making an LED fiber. The LED fiber is formed from a conducting core that is clad with a p-doped semiconductor to form an inner strand. Then, the inner strand is clad with an n-doped semiconductor. At least one of the p-doped semiconductor and n-doped semiconductor includes a light-emitting polymer so that the conducting a current at a lateral location on the LED fiber creates an LED.

These and other objects, advantages and features of the invention will become more readily apparent to those of ordinary skill in the art upon review of the following detailed description of the preferred embodiments, taken in conjunction with the accompanying drawings.

BRIEF DESCRIPTION OF THE DRAWINGS

FIGS. 12A–12J are illustrative applications of a flexible display of FIG. 1 consistent with aspects of the invention.

DETAILED DESCRIPTION OF THE PREFERRED EMBODIMENTS

Figure 1:
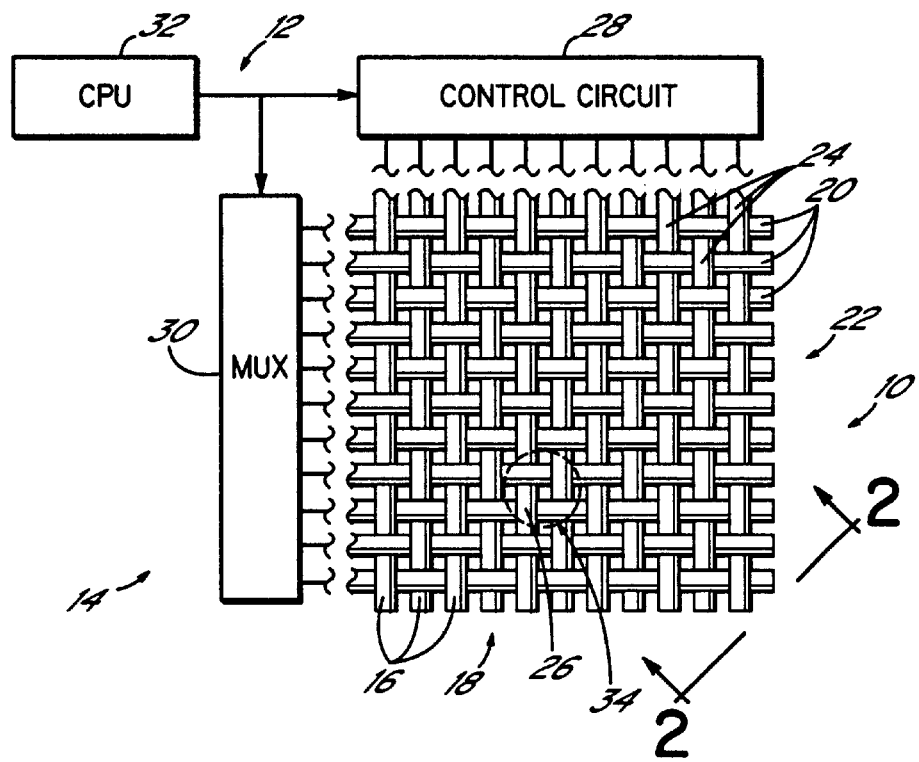
FIG. 1 a block diagram of a light emitting diode fiber matrix activated by a display driver to form a flexible display consistent with aspects of the invention.

Turning to the Drawings, wherein like numbers denote like parts throughout the several views, FIG. 1 depicts a light emitting diode fiber matrix 10 activated by a display driver 12 to form a flexible display 14 consistent with aspects of the invention.

The LED fiber matrix 10 includes a plurality of LED fibers 1 6 forming a warp 18 interlaced with a plurality of conductive strands 20 forming a weft 22. The interlacing physically and electrically isolates each LED fiber 16 from other LED fibers 16 as well as physically and electrically isolating each conductive strand 20 from the other conductive strands 20. Each LED fiber 16 contacts each conductive strand 20 at a lateral location 24. A light-emitting diode (LED) 26 is formed at each lateral location 24, as will be discussed in more detail below with regard to FIGS. 3A and 3B.

Each lateral location 24 is electrically addressable by the display driver 12 by a control circuit 28 and a multiplexer (MUX) 30 completing an electrical circuit that includes one LED fiber 16 and one conductive strand 20. An image is generated upon the LED fiber matrix 10 by coordinating, such as with a central processing unit (CPU) 32, the activation of the LED 26 at each lateral location 24. For example, the CPU 32 may sequentially couple each conductive strand 20 to ground with MUX 30. Each lateral location 24 on the grounded conductive strand 20 is then activated, either sequentially or simultaneously, by the control circuit 28 coupling a voltage to the corresponding LED fibers 16, to illuminate a row of pixels that occur at the intersection of a currently grounded conductive strand 20 and LED fibers 16.

The CPU 32 maps each pixel contained in a transmitted, stored or generated signal to the one or more lateral locations 24 to form a display pixel such as shown at 34. It should be appreciated that the display pixel 34 may be formed from a single lateral location 24, especially for a high resolution, monochromatic flexible display 14. Alternatively, a plurality of adjacent lateral locations 24 may be simultaneously, or nearly simultaneously, activated to form a display pixel 34. For example, a color display pixel 34 may be formed from adjacent LED fibers sequentially provided with hues of red, green and blue.

Figure 2:
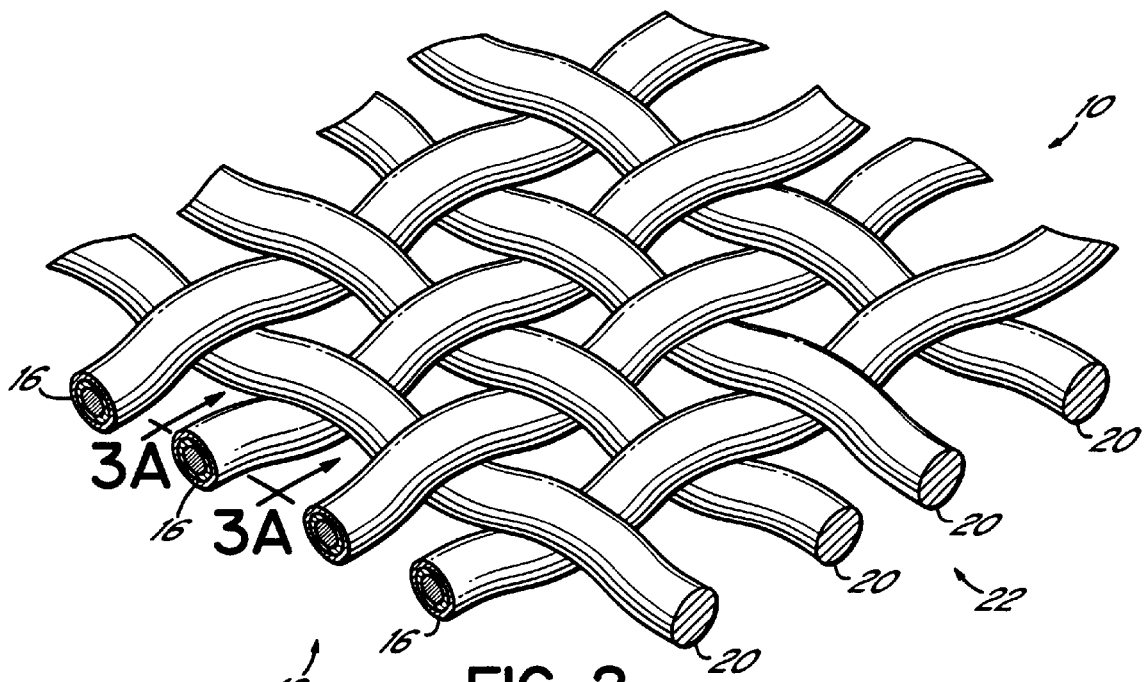
FIG. 2 is a perspective view of the flexible display along line 2—2 of FIG. 1.

Referring to FIG. 2, a perspective depiction of the LED fiber matrix 10, viewed along the line 2—2 of FIG. 1, shows the interlaced, or woven, relationship of the LED fibers 16 and conductive strands 20. Cylindrical cross sections for the LED fibers 16 and conductive strands 20 are for illustrative purposes only. For example, the LED fibers 16 and/or the conductive strands 20 may be ribbon shaped. Ribbon-shaped LED fibers 16 may further be single sided in that the P-N junction described below may be formed on one side.

Figure 3A:
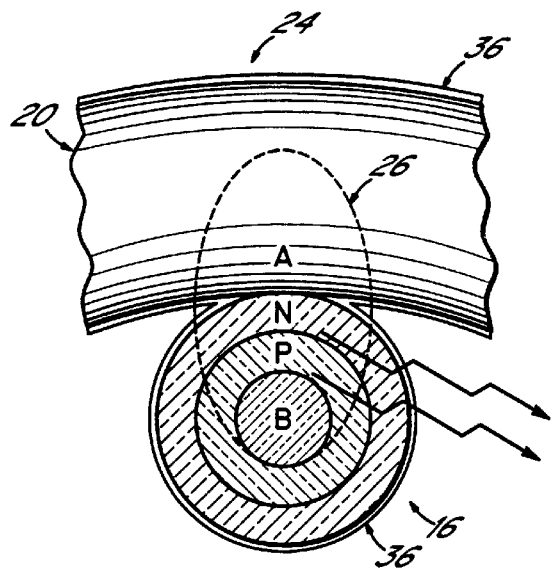
FIG. 3A is a cross-sectional view of a light-emitting diode fiber and a conductor along line 3A—3A of FIG. 2.

Turning to FIG. 3A, a cross-sectional depiction of a lateral location 24 illustrates how an LED 26 is formed from a core forming an electrical base B. About the base B is a semiconductor, light-emitting polymer p-doped layer P. About the p-doped layer P is a semiconductor, light-emitting polymer n-doped layer N. The n-doped layer N contacts the conductor at terminal A.

An insulating layer 36 is advantageously depicted as coating the external portions of the lateral location 24. It should also be appreciated that the insulating layer 36 may advantageously insulate the LED fiber matrix 10 from external contact, and/or assist electrically isolating individual LED fiber 16 or conductive strands 20 from internal shorting. Alternatively, the insulating layer 36 may comprise an oxidation layer. In addition, the insulating layer 36 may enhance the physical coupling of the LED fibers 16 to the conductive strands 20. The insulating layer may contain a pigment so that coated portions of the LED fiber matrix 10 are provided a hue, as an alternative to tinting the LED fibers 16 and/or the conductive strands 20.

It should further be appreciated that an LED fiber matrix 10 consistent with aspects of the invention may be formed as a nonwoven fabric in which the conductive strands 20 merely overlay the LED fibers 16, with the physical contact created by adhesion rather than interlacing. Adhesion may be achieved by dispensing the conductive strands 20 onto the LED fibers 16, whereupon the LED fibers 16 or conductive strands 20 are initially adhesive before setting, or rendered adhesive through heating. Alternatively, the insulating layer 36 may act as the adhesive.

Figure 3B:
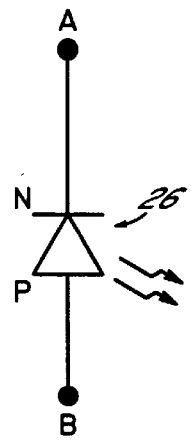
FIG. 3B is a schematic of the light-emitting diode formed by a junction of the light-emitting diode fiber and the conductor of FIG. 3A.

It should be further appreciated that, although an LED fiber 16 is depicted having an outer n-doped layer N, it is consistent with aspects of the invention for the p-doped layer P to be outside the n-doped layer N in FIG. 3A, and thus inverting the p-n junction of the diode 26 depicted in FIG. 3B. Thus, diode 26 would be active with a positive voltage across terminal A and base B.

It will be appreciated that various known LED structures may be fabricated in a fiber consistent with aspects of the invention. Variation in materials, thickness, and combinations of layers may be selected to achieve a desired color, efficiency, manufacturing cost, and brightness. Examples of materials used include gallium, arsenic, and phosphorus (GaAsP) to obtain a red, orange or yellow light source; gallium phosphorus (GaP) for green and red; and gallium nitride (GaN) and silicon carbide (SiC) for a blue light source. In addition, aluminum gallium indium phosphide (AlGaInP) and indium gallium nitride (InGaN) are used for various colors.

Figure 4:
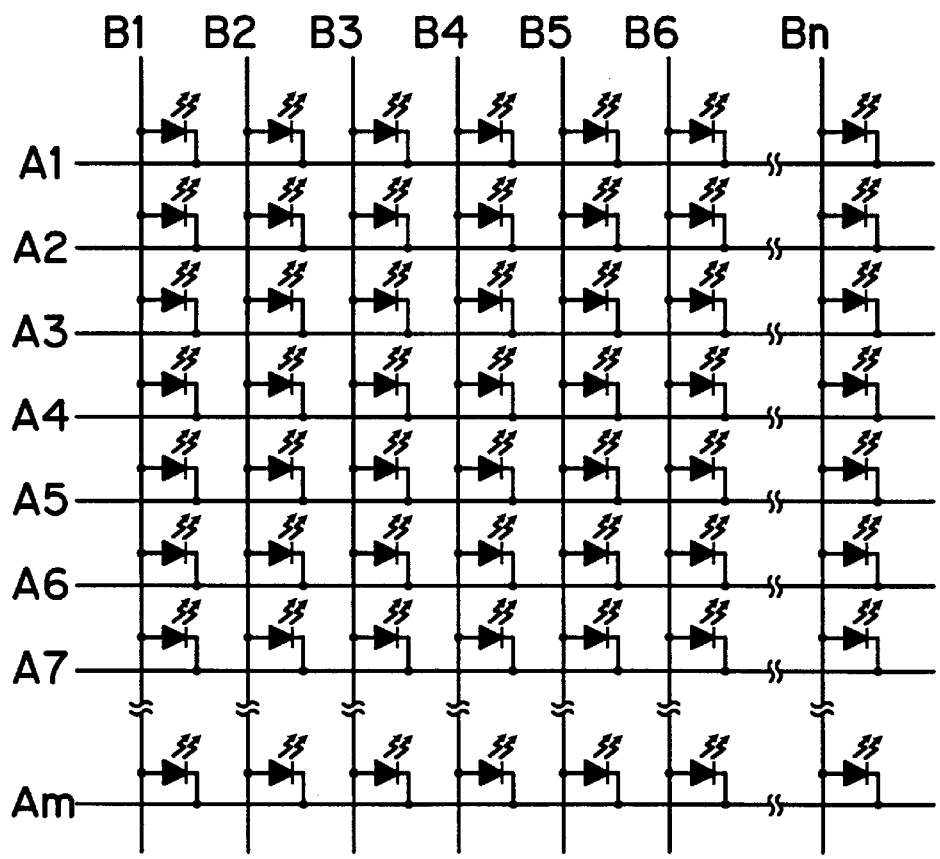
FIG. 4 is a schematic of the light-emitting diode matrix of FIG. 1.

Turning to FIG. 4, the LED fiber matrix 10 is depicted as a schematic of an LED matrix 38, generally known for discrete LEDs (e.g., 8 by 8 alphanumeric indicator) and semiconductor LED matrices formed on a wafer substrate.

Figure 5:
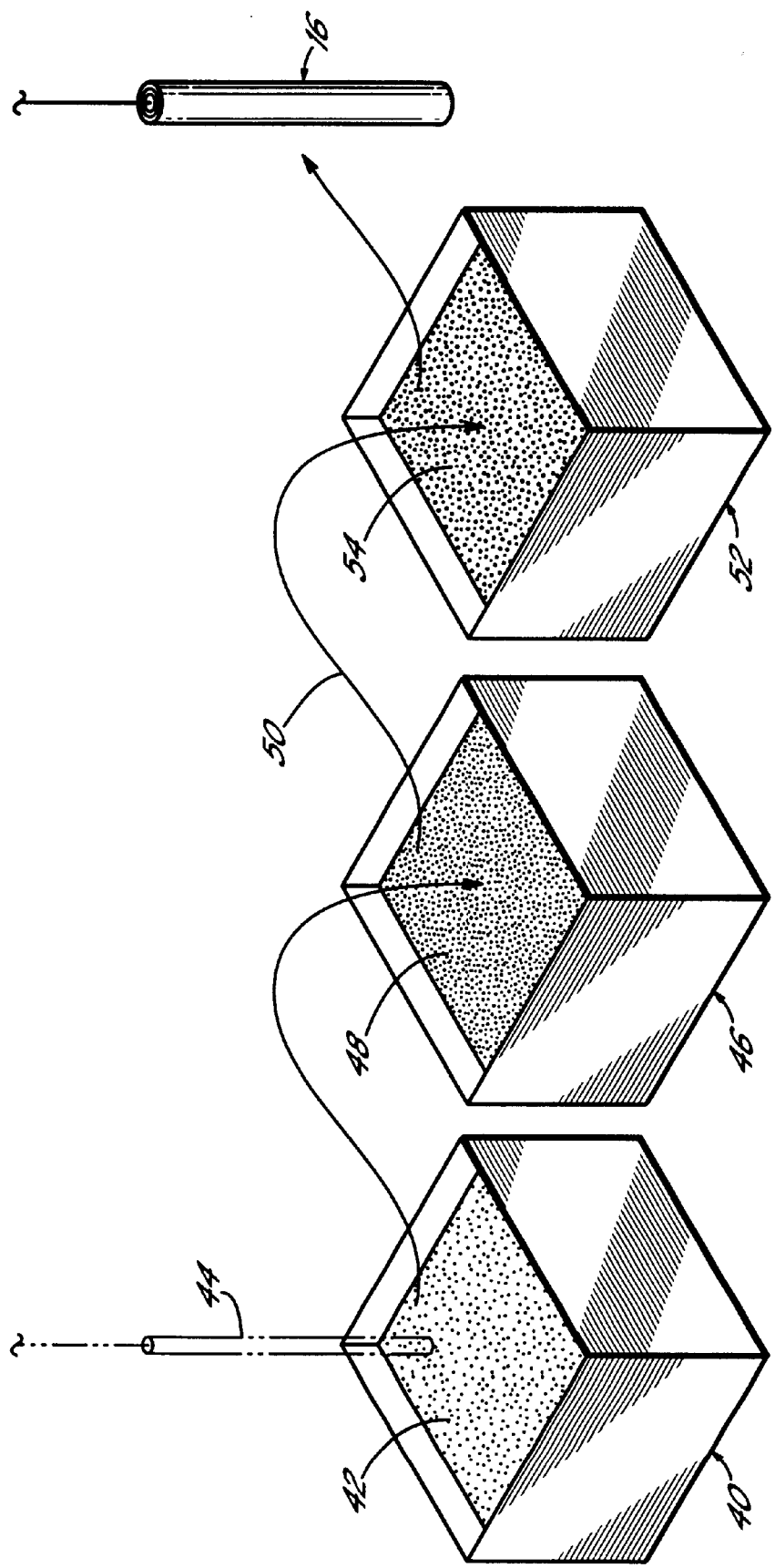
FIG. 5 is a simplified depiction of fabricating the light-emitting diode fiber of FIG 1.

Turning to FIG. 5, a method of fabricating an LED fiber 16 is shown in simplified form. A first reservoir 40 contains a conductive liquid 42 that is drawn out, or extruded, as a core strand 44. The core strand 44 solidifies and is then passed through a second reservoir 46 containing a semiconductor light-emitting polymer p-doped liquid 48 that is allowed to solidify as the p-doped layer P on the core strand 42, forming an inner strand 50. The inner strand 50 is passed through a third reservoir 52 containing a semiconductor light-emitting polymer n-doped liquid 54 that is allowed to solidify as the n-doped layer N, forming the LED fiber 16.

Figure 6:
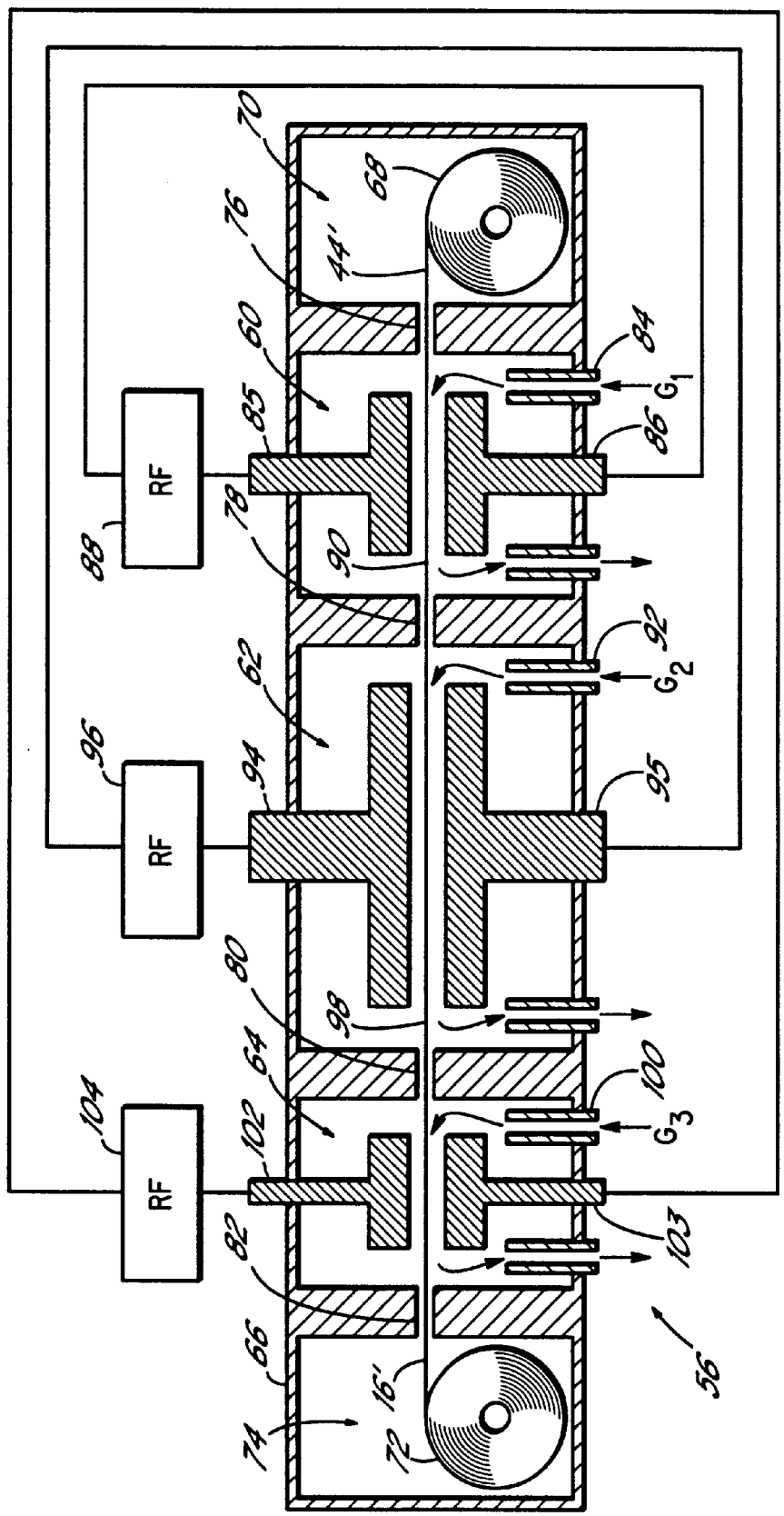
FIG. 6 is a simplified depiction of a continuous plasma processing system for fabricating LED fibers.

Turning to FIG. 6, a simplified depiction of a plasma processing system 56 provides for continuous fabrication of an LED fiber 16'. Depending on the materials selected, various types of plasma processing may be used, such as Metallo Organic Chemical Vapor Deposition (MOCVD). Liquid Phase Epitaxy (LPE) is also used.

Three reaction chambers 60, 62, 64 within a vacuum chamber 66 illustrate an application of three layers onto a core strand 44' taken from a supply roll 68 in a supply chamber 70 and stored on a take-up roll 72 in a take-up chamber 74. Each chamber 60, 62, 64, 70, 74 is gas isolated from each other by buffer chambers 76, 78, 80, 82.

Within the first reaction chamber 60, a precursor gas G1 is introduced through gas inlet port 84. Discharge electrodes 85, 86 are electrified by a Radio Frequency (RF) source 88 to create a plasma discharge atmosphere to deposit a lower cladding, such as an $In_{0.5}(Ga_{1-y}Al_y)_{0.5}P$, n doping=1E18, of 1 µm thickness, forming an inner strand 90.

Then, the inner strand 90 passes into the second reaction chamber 62 where a second precursor gas G2 is introduced through gas inlet port 92. Discharge electrodes 94, 95 are electrified by RF source 96 to deposit an active layer, such as an $In_{0.5}(Ga_{1-y}Al_y)_{0.5}P$, n doping=1E17, of 0.5 µm thickness to form an intermediate strand 98.

Then, the intermediate strand 98 passes into the third reaction chamber 64 where a gas precursor G3 is introduced through gas inlet port 100. Discharge electrodes 102, 103 are electrified by RF source 104 to deposit an upper cladding of such as an $In_{0.5}(Ga_{1-y}Al_y)_{0.5}P$, p doping=1E17, of 1 μm thickness to form the LED fiber 16'.

The value of y for the lower cladding, active layer, and upper cladding is selected for the desired color. For example, for red the cladding or confinement layers are $In_{0.5}(Ga_{0.3}Al_{0.7})_{0.5}P$. The resulting LED fiber 16' is high brightness LED having a heterostructure. The thickness of each layer or cladding may be controlled with the frequency and power of the RF field from the discharge electrodes 85, 86, 94, 95, 102, 103, the concentration of precursor gas G1, G2, G3, and speed of the strand 44. Furthermore, for arrangements in which the plasma discharge atmosphere is asymmetric with respect to the strand 44, a rotation may be imparted to the strand 44 or the discharge electrodes 85, 86, 94, 95, 102, 103 to more evenly coat the strand 44.

Alternatively, the plasma processing system 56 may use one reaction chamber 60 with the precursor gas G1 changed during each pass of the strand 44 to sequentially build up the desired layers.

Figure 7:
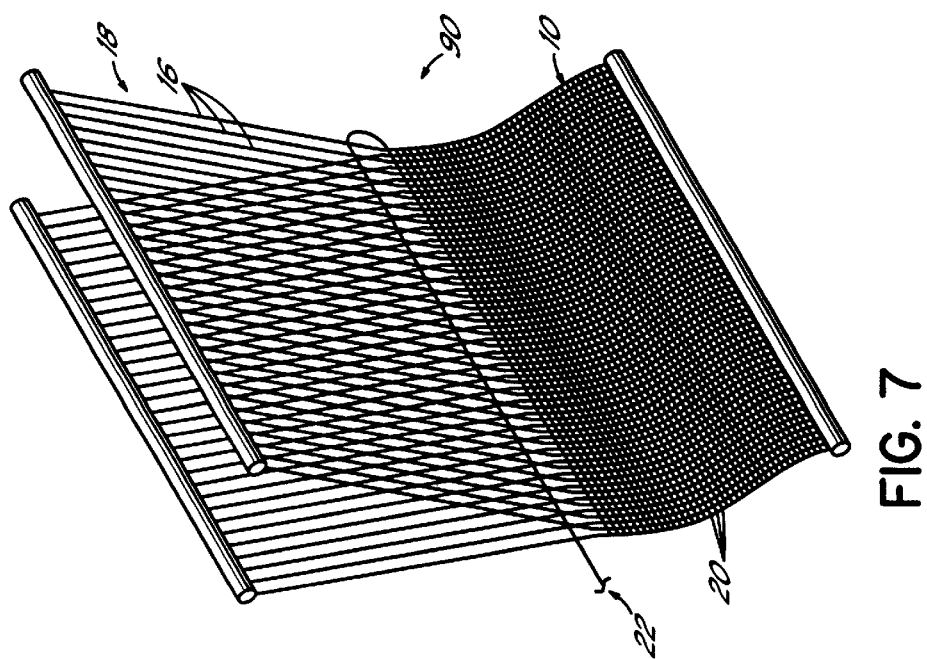
FIG. 7 is an illustrative depiction of weaving the light-emitting diode fibers into the light emitting diode fiber matrix of FIG. 1.

Turning to FIG. 7, a simplified loom 90 is depicted for interlacing the warp 18 of LED fibers 16 with a weft 22 of conducting material, each pass of the weft 22 disconnected from the preceding and subsequent passes forming the conductive strands 20 of the woven LED fiber matrix 10.

Figure 8:
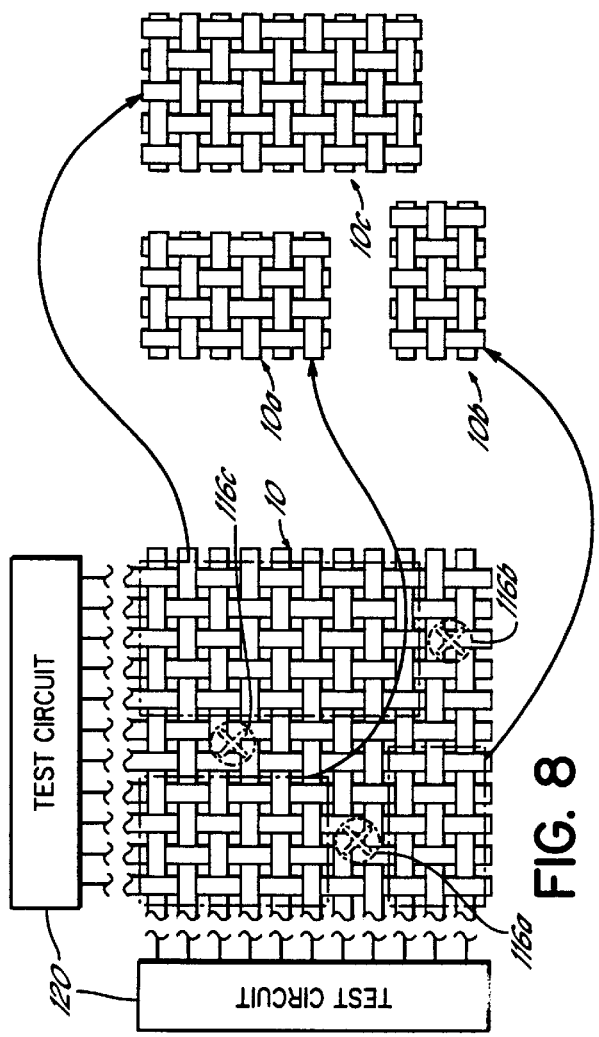
FIG. 8 is an illustrative depiction of extracting one or more light emitting diode fiber matrices from a flawed light emitting diode fiber matrix formed by the method of FIG. 7.

Turning to FIG. 8, the output of the loom 110 of FIG. 7 is a large LED fiber matrix 10, that contains flaws 116a–116c. From this, one or more LED fiber matrices 10a–10c are extracted that do not contain the flaws 116a–116c. Various types of flaws may occur due to process variations. One type of flaw may be an open circuit at the lateral location. For example, the conductive strand 20 may fail to contact the LED strand 16 at the lateral location, or be separated by an insulating material such as a contaminant. As another example, the conductive strand 20 or the LED fiber 16 may be broken or be improperly doped to be conductive. As another type of flaw, the LED fiber 16 may be improperly fabricated such that a p-n junction is not formed, detectable as an out-of-range resistance. As another type of flaw, the light-emitting polymer in the LED fiber 16 may be evident as inadequate luminescence in response to activation of the p-n junction of the diode D.

Detecting each flaw 116a–116c may be achieved by connecting a test circuit 120 that sequentially biases the LED fibers 16, grounds the conductive strands 20, and senses the activation of each diode D, such as by the current, resistance or luminescence of the diode D. In response to detecting flaws 116a–116c in the larger LED fiber matrix 10, smaller LED fiber matrixes 10a–10c may be extracted by cutting from large matrix 10, such that flaws 116a–116c are outside of the periphery of each matrix 10a–10c.

Figure 9:
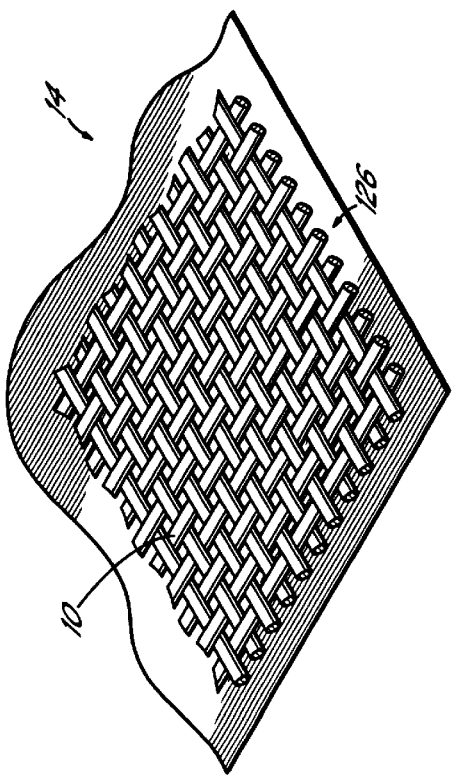
FIG. 9 is a backing surface enhanced light emitting diode fiber matrix.

Turning to FIG. 9, a flexible display 14 that includes an LED fiber matrix 10 is placed in front of a backing surface 126. The backing surface 126 may provide physical support to provide a desired contour to the LED fiber matrix 10. In addition, the backing surface 126 may advantageously illuminate to increase the overall brightness of the flexible display 14. Alternatively, the backing surface 126 may be reflective to increase the illumination from the LED fiber matrix 10 to one side. A reflective backing surface 126 may advantageously balance the luminescence from downward oriented lateral locations 24 and upward oriented lateral locations 24. Furthermore, the backing surface 126 may include a phosphor to enhance the illumination from the LED fiber matrix 10.

Figure 10:
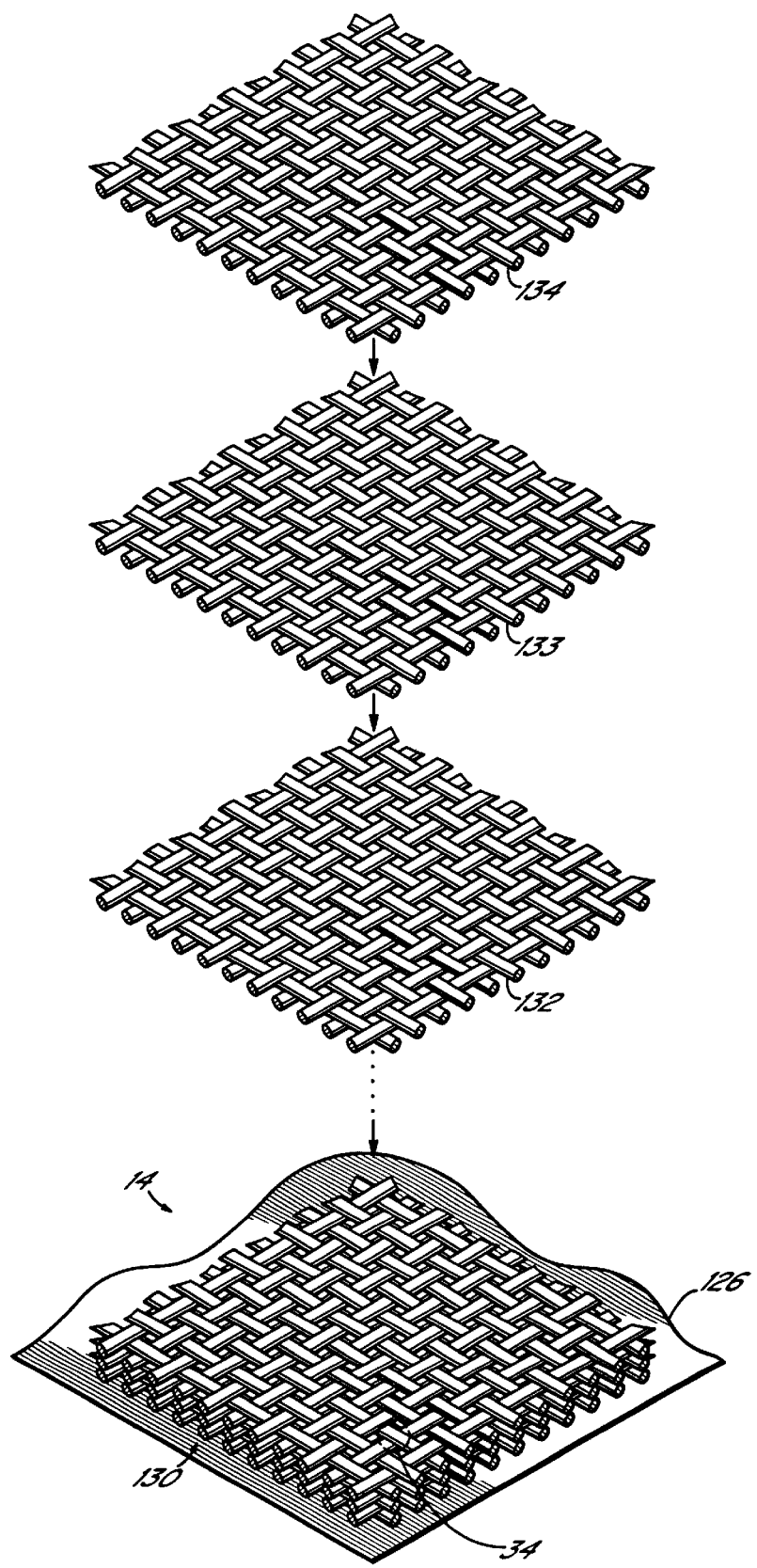
FIG. 10 is a color light emitting diode fiber matrix composed of a stack of monochrome light emitting diode fiber matrices.

Turning to FIG. 10, a color flexible display 10 is depicted where a color LED fiber matrix 130 is formed from a stack of a first LED fiber matrix 132, a second LED fiber matrix 133, and a third LED fiber matrix 134. Each of the first, second and third LED fiber matrices 132–134 is given a different hue, such as red, green and blue. Alternatively, the sequentially positioned fibers in each matrix 132–134 may be arranged such that red, green and blue fibers overlap in the stacked matrix 1 30. Consequently, a full range of colors may be generated at a display pixel that encompasses a corresponding lateral location from each of the matrices 132–134.

It should be appreciated that the use of three colors (red, green, blue) in either lateral arrangement or in vertical arrangement is for illustration only. In some applications, different hues may be combined to produce colors of interest. Also, rather than varying the intensity of light generated by certain lateral locations 24 to produce a color, multiples of one hue may be used such that a full range of colors may be produced. For example, since the visual spectrum is dominated by green for human perception, two strands or layers of green for each strand or layer of red and blue may be used to produce colors.

Figure 11:
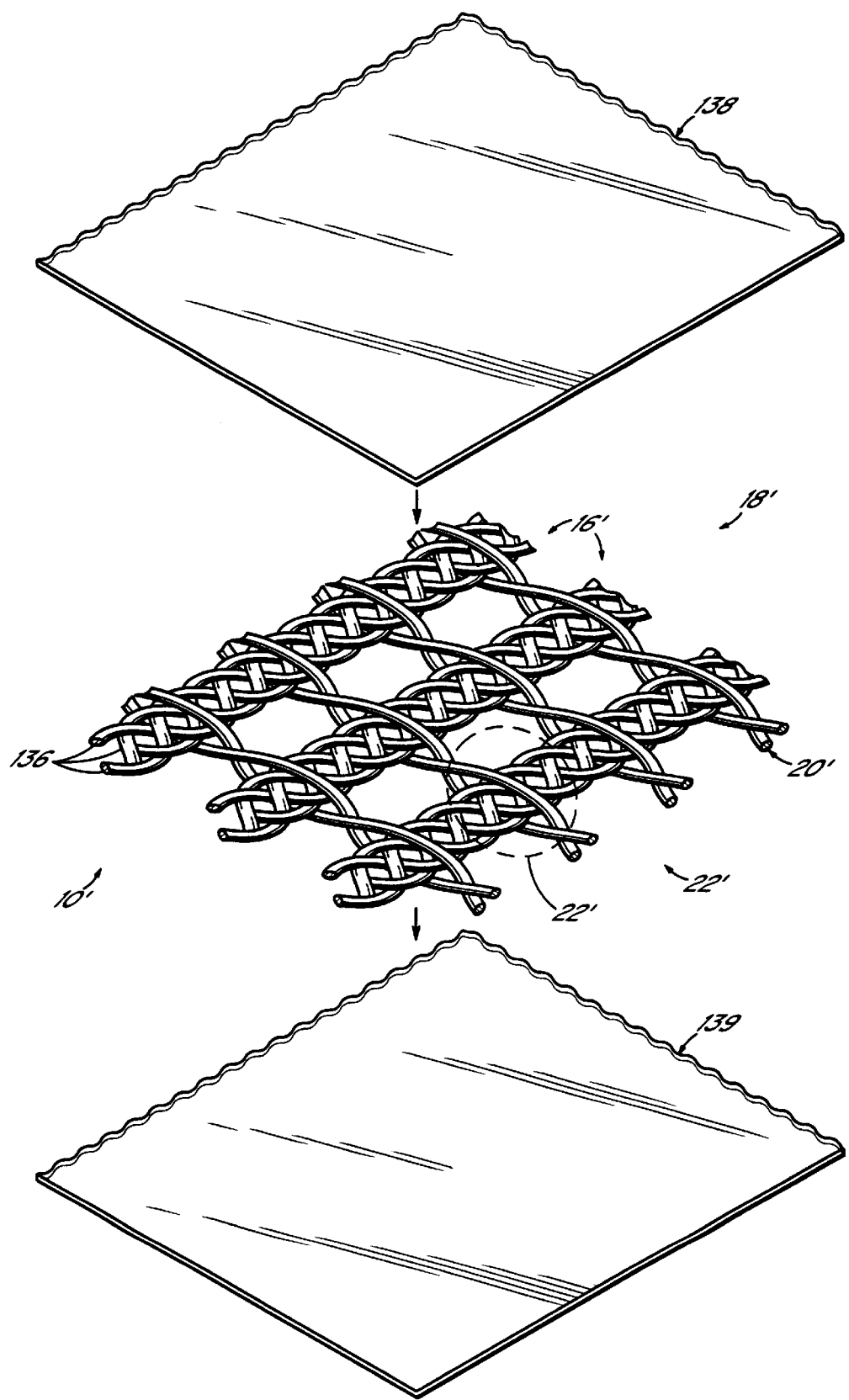
FIG. 11 is a multi-woven, pacified LED matrix.

Referring to FIG. 11, a flexible LED matrix 10' illustrates a warp 18' formed from a plurality of woven LED fibers 16'. Each woven LED fiber 16' may allow greater illumination or selection of hues at a given lateral location 24' than available from each individual strand 136 woven to form a woven LED fiber 16'. Thus, each strand 136 of the woven LED fiber 16' may be individually tinted to achieve a desired hue. Also, one of the strands 136 of a woven LED fiber 16' may be a phosphor to advantageously increase the visible illumination from strands 1 36 that emit non-visible energy, such as ultraviolet.

The weft 22' is illustrated as being formed of double-woven conductive strand pairs 20'. The conductive strand pairs 20' may increase physical positioning and isolation of each LED fiber 16'. In addition, the conductive strand pairs 20' increase the illumination from each lateral location 24' since LEDs 26 are formed on both faces of the LED fiber matrix 10' at each lateral location 24'.

Laminating sheets 138, 139 advantageously sandwich the matrix 10'to pacify and protect the matrix 10'.

It should be appreciated that LED fiber matrices 10' consistent with aspects of the invention may be achieved with various weave designs. In addition, an LED fiber matrix 10' may include additional fibers such as for reflectance, strength, thermal insulation, and/or heat conduction.

Turning to FIGS. 12A–12J, examples are illustrated of the many uses of a flexible display 10 consistent with aspects of the invention.

FIG. 12A depicts a curved surface 140, such as a sign post, upon which an advertisement or announcement is displayed on a flexible display 14.

FIG. 12B depicts a notebook computer 142 incorporating a flexible display 14 stored as roll or other convenient shape within the case of the notebook computer 142.

FIG. 12C depicts a sheet-like article 144 that contains a flexible display 14. The sheet-like article 144 allows for convenient storage such as by the depicted rolling. Furthermore, the sheet-like article 144 may advantageously include interactive features such as a thin-film keypad 146 so that the sheet-like article may function as a portable computer, a data browser, a calculator, a programmable calendar, etc.

FIG. 12D depicts a garment 147 onto which is affixed, or the fabric of the garment 147 is itself, a flexible display 14, enabling dynamically illuminated displays while retaining the comfort of a fabric garment. A garment 147 may advantageously be selectively colored or patterned to coordinate with other garment items. For example, a garment 147 such as a scarf or tie may be selectively changed in color to match a shirt or blouse. In addition, the illumination of the flexible display 14 may enhance safety, such as for wearing the garment 147 while running at night.

Figure 12E:
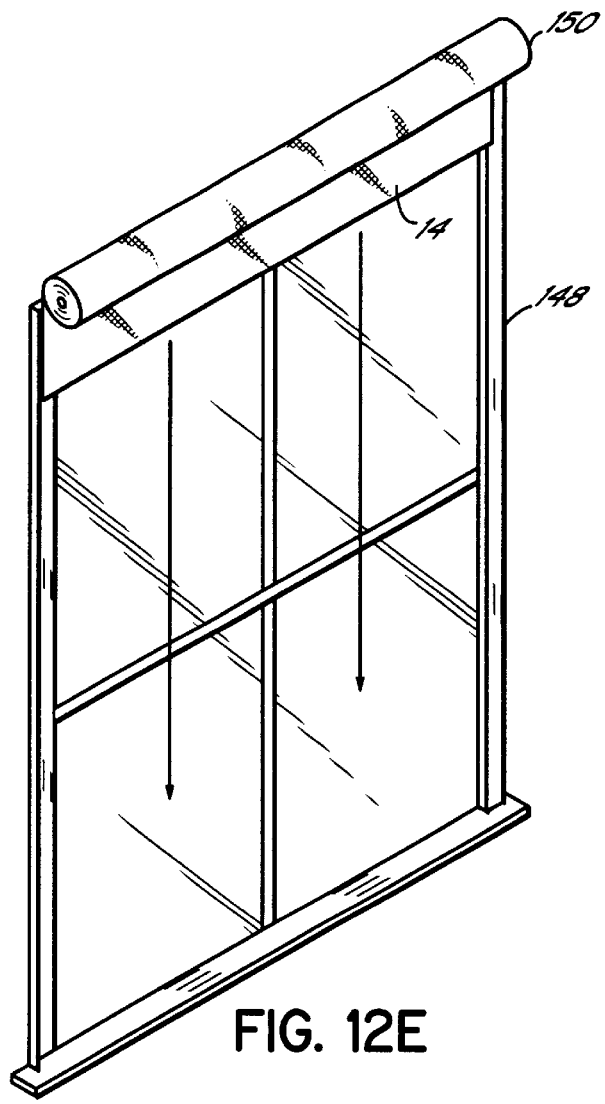

FIG. 12E depicts a window 148 having a window blind 150 that incorporates a flexible display 14, thus allowing a window blind that may be used for presenting still or video images.

Figure 12F:
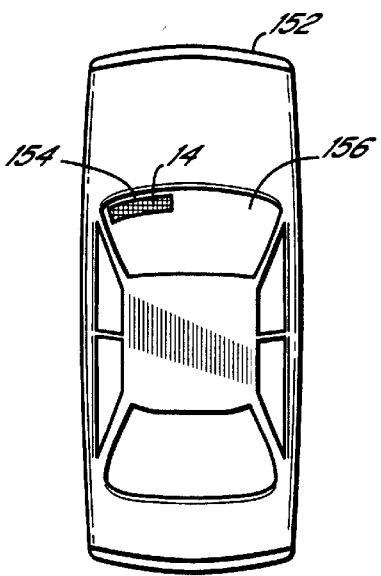

FIG. 12F depicts a vehicle 152 that has a heads-up display (HUD) 154 affixed to, or embedded in, a windshield 156. The HUD 154 includes a flexible display 14 positioned to be conveniently viewed by a driver. The HUD 154 may have a translucence and/or looseness of weave allows for viewing through the flexible display 14.

Figure 12G:
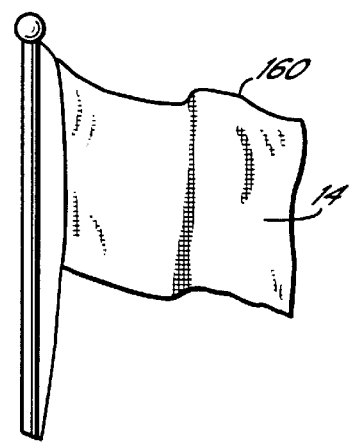

FIG. 12G depicts a self-illuminating flag 160 that may include, or be entirely composed of, a flexible display 14. In addition to providing self-illumination, the flag 160 may be selectable to provide various color images.

Figure 12H:
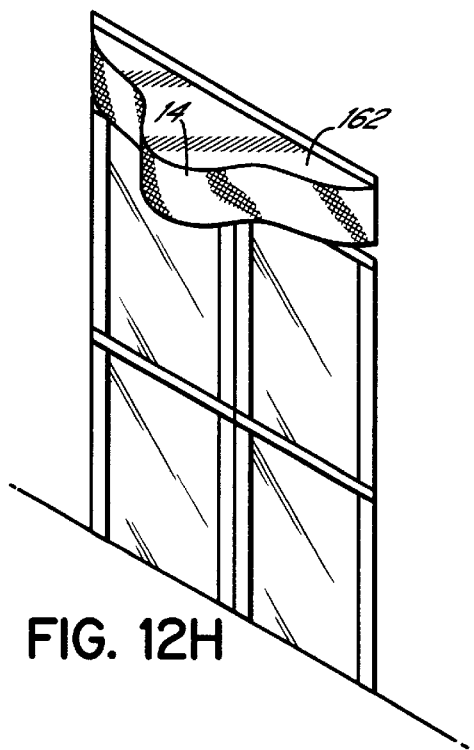

FIG. 12H depicts a curved banner display 162, such as a scrolling alphanumeric message board or stock ticker. The banner display 162 incorporates a flexible display 14, and thus can readily adapt to the contour of various underlying structures.

Figure 12I:
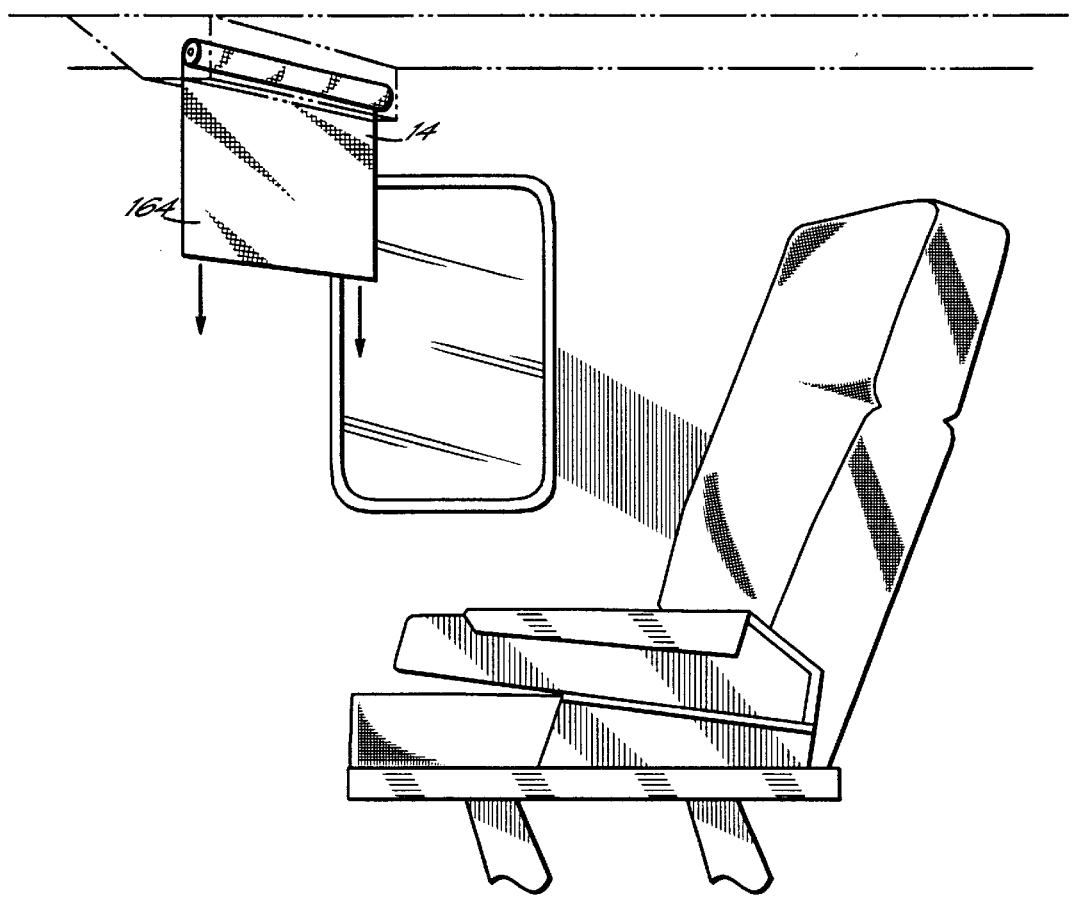

FIG. 12I depicts a flexible vehicle entertainment system 164 that incorporates a flexible display 14. Unlike generally known rigid displays, the entertainment system 164 does not pose a safety hazard due to a passenger inadvertently bumping the display 14.

Figure 12J:
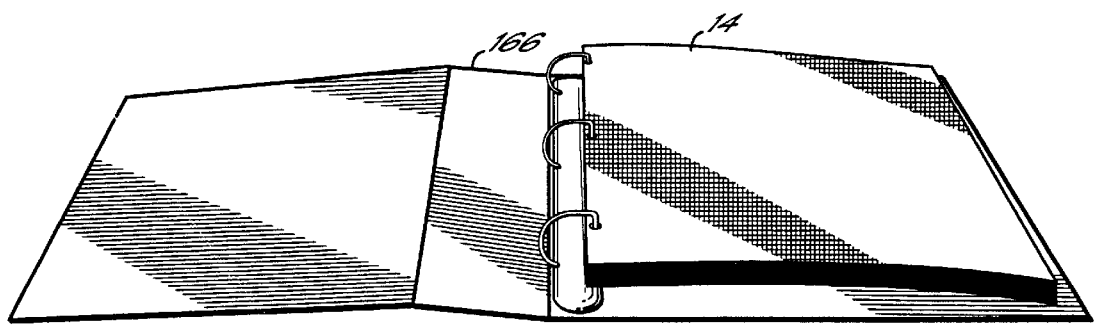

FIG. 12J depicts a dynamic book 166 that incorporates a plurality of sheet-like flexible displays 14. The dynamic book 166 is programmed to display graphics or text so that a user may use the dynamic book 166 like a traditional book or magazine. In addition, the dynamic book 166 may store additional display information so that the sheet-like flexible displays 14 only show a portion at a time of the available display information. Furthermore, unlike traditional books and magazines, the dynamic book 166 may include animated graphics, or interactive controls.

While the present invention has been illustrated by a description of the preferred embodiments and while these embodiments have been described in some detail, it is not the intention of the Applicant to restrict or in any way limit the scope of the appended claims to such detail. Additional advantages and modifications will readily appear to those skilled in the art. This has been a description of the present invention, along with the preferred methods of practicing the present invention as currently known. Various aspects of this invention may be used alone or in different combinations. The scope of the invention itself should only be defined by the appended claims, wherein

I claim:

1. A light-emitting diode (LED) matrix comprising:
    a plurality of LED fibers, each LED fiber electrically isolated from and in substantially parallel alignment to the other LED fibers, each LED fiber comprising a conducting core, a first doped layer circumferentially surrounding the conducting core, and a second doped layer circumferentially surrounding the first doped layer, the first and second doped layers forming a semiconductor junction; and
    a plurality of conductive strands, each conductive strand electrically isolated from and in substantially parallel alignment to the other conductive strands, the plurality of conductive strands interwoven with the plurality of LED fibers, each one of the conductive strands electrically coupling to one of the plurality of LED fibers at a respective one of a plurality of lateral locations, each one of the plurality of lateral locations forming a light-emitting diode.

2. The light-emitting diode (LED) matrix of claim 1, wherein the first doped layer comprises a p-doped semiconductor of light-emitting polymer, the second doped layer comprises an n-doped semiconductor of light-emitting polymer.

3. The light-emitting diode (LED) matrix of claim 1, further comprising an insulating layer electrically isolating an exterior portion of the LED matrix.

4. The light-emitting diode (LED) matrix of claim 1, wherein each one of the plurality of LED fibers has a sequentially selected one of a plurality of hues for forming a color display.

5. The light-emitting diode (LED) matrix of claim 1, further comprising a second and third LED matrix, wherein the first, second, and third LED matrices in stacked relation each include a sequentially selected one of three hues.

6. The light-emitting diode (LED) matrix of claim 1, further comprising a backing surface in a substantially parallel relation to the interwoven pluralities of conductive strands and LED fibers.

7. The light-emitting diode (LED) matrix of claim 5, wherein the backing surface comprises a reflective surface.

8. A flexible display comprising the light emitting diode (LED) matrix of claim 1 and a display driver electrically coupled to the LED matrix for illuminating a lateral location by selectively coupling one of the plurality of conductive strands and one of the plurality of LED fibers.

9. The light-emitting diode (LED) matrix of claim 1, further comprising a second plurality of LED fibers, each LED fiber of the first plurality contactingly lengthwise paired with a selected one of the second plurality of LED fibers.

10. A method of fabricating a light-emitting diode (LED) matrix, the method comprising:
    forming a conducting core;
    cladding the conducting core with a p-doped semiconductor to form an inner strand; and
    cladding the inner strand with an n-doped semiconductor to form an LED fiber.

11. The method of claim 10, further comprising:
    forming a warp of a plurality of LED fibers;
    interlacing an electrically conductive weft through the warp to form a flexible light emitting diode (LED) matrix, each pass of the weft uncoupled from other passes of the weft to form a plurality of conductive strands, each one of the conductive strands contacting each one of the plurality of LED fibers at a respective one of a plurality of lateral locations, each lateral location forming a light-emitting diode.

12. The method of claim 11, further comprising:
    coating at least a portion of the light emitting diode (LED) matrix with an insulating material.

13. The method of claim 11, further comprising:
    coupling each of the plurality of LED fibers to a first bus connector; and
    coupling each of the plurality of conductive strands to a second bus connector.

14. The method of claim 11, further comprising:
    stacking a second and a third LED matrix on the first LED matrix, wherein the first, second, and third LED matrices respectively include a sequentially selected one of three hues.

15. The method of claim 11, further comprising:

placing a backing surface in a substantially parallel relation to the interwoven pluralities of conductive strands and LED fibers.

16. A method of producing a flexible light-emitting diode matrix, the method comprising:

weaving a fabric having a warp and a weft, the warp formed from a plurality of LED fibers, the weft formed from a plurality of conductive strands, each one of the plurality of LED fiber coupled to each one of the plurality of conductive strands at a respective one of a plurality of lateral locations;

placing a voltage across ones of the plurality of lateral locations;

comparing the response to the voltage of ones of the plurality of lateral locations to a predetermined characteristic;

designating a failed lateral location for one of the plurality of lateral locations sensed having the predetermined characteristic; and extracting an LED matrix not including the failed lateral location.

17. The method of claim 16, wherein the predetermined characteristic is one of an open circuit and a short circuit.

18. The method of claim 16, wherein the predetermined characteristic is luminosity.

* * * * *